(12) United States Patent
Hishida et al.

(10) Patent No.: US 9,627,554 B2
(45) Date of Patent: *Apr. 18, 2017

(54) SOLAR CELL MODULE

(71) Applicant: PANASONIC INTELLECTUAL PROPERTY MANAGEMENT CO., LTD., Osaka (JP)

(72) Inventors: Yuji Hishida, Osaka (JP); Yasufumi Tsunomura, Kobe (JP); Eiji Maruyama, Katano (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 250 days.

This patent is subject to a terminal disclaimer.

(21) Appl. No.: 13/652,747

(22) Filed: Oct. 16, 2012

(65) Prior Publication Data

US 2013/0037079 A1 Feb. 14, 2013

Related U.S. Application Data

(63) Continuation of application No. 11/946,159, filed on Nov. 28, 2007, now Pat. No. 8,314,323.

(30) Foreign Application Priority Data

Nov. 29, 2006 (JP) .................. 2006-322084

(51) Int. Cl.
*H01L 31/00* (2006.01)
*H01L 31/042* (2014.01)
(Continued)

(52) U.S. Cl.
CPC .. *H01L 31/0201* (2013.01); *H01L 31/022425* (2013.01); *H01L 31/022433* (2013.01);
(Continued)

(58) Field of Classification Search
CPC ............... H01L 31/042; H01L 31/0201; H01L 31/02013; H01L 31/022433;
(Continued)

(56) References Cited

U.S. PATENT DOCUMENTS 8,314,323 B2 * 11/2012 Hishida et al. ............... 136/244

FOREIGN PATENT DOCUMENTS

JP 09260696 A * 10/1997
JP 2000261012 A * 9/2000
(Continued)

OTHER PUBLICATIONS

JP 2000-261012A English machine translation.*
(Continued)

*Primary Examiner* — Lindsey Bernier
(74) *Attorney, Agent, or Firm* — McDermott Will & Emery LLP

(57) ABSTRACT

A solar cell module includes: two solar cells, each including: a first main face and a second main face; a first electrode on the first main face, comprising a bus-bar electrode having at least one of an opening portion, notch portion, and gap portion; and a second electrode on the first or second main face having a polarity opposite to that of the first electrode; a wiring member that electrically connects the first electrode of one solar cell to the second electrode of another solar cell; and an electrically conductive connection layer that contacts the wiring member and the first main face.

24 Claims, 4 Drawing Sheets

(51) Int. Cl.
*H02N 6/00* (2006.01)
*H01L 31/02* (2006.01)
*H01L 31/05* (2014.01)
*H01L 31/0224* (2006.01)

(52) U.S. Cl.
CPC .......... *H01L 31/05* (2013.01); *H01L 31/0512* (2013.01); *Y02E 10/50* (2013.01)

(58) Field of Classification Search
CPC ........ H01L 31/05–31/0512; H01L 31/022425; Y02E 10/50
USPC ........................................ 136/244, 252, 256
See application file for complete search history.

(56) References Cited

FOREIGN PATENT DOCUMENTS

| | | | | |
|---|---|---|---|---|
| JP | 2001085711 | A | * | 3/2001 |
| JP | 2002359381 | A | * | 12/2002 |
| JP | 2005252062 | A | * | 9/2005 |

OTHER PUBLICATIONS

JP 2005-252062A English machine translation.*
English machine translation of JP 2002-359381A.*
English machine translation of JP 09-260696A.*
English machine translation of JP 2001-085711A.*

* cited by examiner

SOLAR CELL MODULE

CROSS REFERENCE TO RELATED APPLICATION

This application is a continuation of application Ser. No. 11/946,159, filed on Nov. 28, 2007, now U.S. Pat. No. 8,314,323, which claims priority based on 35 USC 119 from prior Japanese Patent Application No. 2006-322084 filed on Nov. 29, 2006, the entire contents of which are incorporated herein by reference.

BACKGROUND OF THE INVENTION

1. Field of the Invention

The present invention relates to a solar cell module in which the connecting electrodes of solar cells are electrically interconnected by wiring members.

2. Description of the Related Art

The solar cell attracts attention as a new environmentally friendly energy source, because it can convert light from the sun, which is an unlimited source of clean energy, directly into electricity.

When such the solar cell is used as a power source (energy source), since a single solar cell produces an output of approximately a few watts at most, the solar cell is generally used not in units of one solar cell but in the form of a solar cell module. In the solar cell module, as will be described below, a plurality of solar cells are connected in series to increase an output to 100 watts or greater.

Conventionally, in the solar cell module, the connecting electrodes of a plurality of solar cells are electrically interconnected by wiring members made from a conductive material such as copper foil. The solar cells are sealed with a translucent sealing member made of EVA (Ethylene Vinyl Acetate) or the like, between a acceptance face protective member made of glass, translucent plastic, or the like and a back face protective member made from a film of PET (PolyEthylene Terephthalate) or the like.

In the solar cell, a pair of electrodes for output extraction is formed on main faces of a photoelectric conversion body. In general, the pair of electrodes is formed on the acceptance face and back face of the photoelectric conversion body, respectively. In this case, the electrode provided on the acceptance face is formed into a comb-like shape having a plurality of finger electrodes and a bus-bar electrode formed of a conductive paste. The wiring member is bonded by a solder onto the bus-bar electrode provided on the acceptance face of one solar cell and onto the bus-bar electrode provided on the back face of another solar cell, whereby a plurality of solar cells are connected in series (for example, see Japanese Patent No. 3754208). Accordingly, the bus-bar electrode, the solder, and the wiring member are stacked in layers in this order at least on the acceptance face of the photoelectric conversion body.

BRIEF SUMMARY OF THE INVENTION

The present invention has been made to solve the above-mentioned problems, and an object thereof is to provide a solar cell module that is highly reliable against the temperature changes.

A first aspect of the present invention is the provision of a solar cell module, comprising: two solar cells, each including: a photoelectric conversion body which has first and second main faces and generates photogenerated carriers; a first electrode which is provided on the first main face, has a plurality of finger electrodes for collecting the photogenerated carriers generated in the photoelectric conversion body, and has a bus-bar electrode for collecting the photogenerated carriers collected by the plurality of finger electrodes; and a second electrode which is provided on any one of the first and second main faces and has a polarity opposite to that of the first electrode; and a wiring member for electrically connecting the first electrode of one solar cell of the two solar cells to the second electrode of the other solar cell, wherein: the wiring member is connected onto the bus-bar electrode of the first electrode of the one solar cell through a connection layer formed of a first conductive resin containing conductive material.

A second aspect of the present invention is related to the first aspect of the present invention, and is summarized in that the connection layer is in contact with the first main face of the photoelectric conversion body in a region where the connection layer overlaps with the wiring member when viewed in a direction perpendicular to the first main face.

A third aspect of the present invention is related to the second aspect of the present invention, and is summarized in that the bus-bar electrode has any one of at least one of opening portion, notch portion, and gap portion, and the opening portion, notch portion, or gap portion is filled with the connection layer, whereby the connection layer is in contact with an exposed portion of the first main face of the photoelectric conversion body.

A fourth aspect of the present invention is related to the first aspect of the present invention, and is summarized in that the bus-bar electrode is formed of a second conductive resin containing conductive material, and adhesive strength of the first conductive resin to the first main face is stronger than adhesive strength of the second conductive resin to the first main face.

A fifth aspect of the present invention is related to the first aspect of the present invention, and is summarized in that, in the bus-bar electrode, an area of a first face which comes in contact with the first main face is larger than an area of a second face which is a reverse of the first face.

BRIEF DESCRIPTION OF THE SEVERAL VIEWS OF THE DRAWINGS

FIG. 2B is a plane view of the solar cells 1a and 1b and the wiring member 2a.

DETAILED DESCRIPTION OF THE INVENTION

Figure 1:
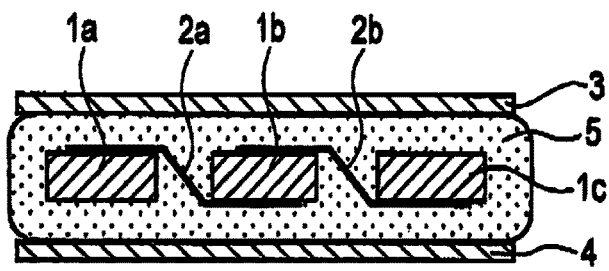
FIG. 1 is a section view showing an overall configuration of a solar cell module according to an embodiment of the present invention.

Hereinafter, an embodiment of the present invention will be described with reference to the accompanying drawings. Like parts are denoted by the same reference numerals and symbols throughout the drawings.

An overall configuration of a solar cell module according to an embodiment of the present invention will be described with reference to FIG. 1. The solar cell module includes a plurality of (for example, three) solar cells 1a to 1c. The respective of the solar cells 1a to 1c is connected in series through a wiring member 2a and a wiring member 2b, which are formed from copper foil with tinned surfaces. The plurality of solar cells 1a to 1c is sealed with a translucent sealing member 5 made of EVA or the like, between a translucent front protective member 3 made of glass, translucent plastic, or the like and a back protective member 4. The back protective member 4 is made from a PET (or the like) film or a laminated material obtained by sandwiching a thin metal (such as aluminum) film between PET (or the like) films, or the like.

Figure 2A:
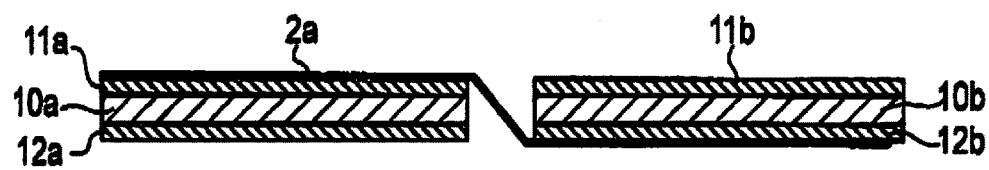
FIG. 2A is an enlarged section view of solar cells 1a and 1b and a wiring member 2a shown in FIG. 1.

The configuration of the solar cells 1a to 1c and the placement of the wiring members 2a and 2b in FIG. 1 will be described with reference to FIGS. 2A and 2B, by taking the solar cells 1a and 1b and the wiring member 2a as an example. The solar cell 1a includes a photoelectric conversion body 10a, in which photogenerated carriers are generated by the incidence of light, and a pair of positive and negative electrodes for taking the photogenerated carriers generated in the photoelectric conversion body 10a. The solar cell 1b includes a photoelectric conversion body 10b, in which photogenerated carriers are generated by the incidence of light, and a pair of positive and negative electrodes for taking the photogenerated carriers generated in the photoelectric conversion body 10b.

In general, the pair of positive and negative electrodes are respectively provided on the acceptance face and the back face of each of the photoelectric conversion bodies 10a and 10b. In this case, the pair of positive and negative electrodes, those provided on the acceptance faces is formed into, for example, a comb-like shape by a combination of a plurality of finger electrodes 21a or 21b having a narrow-width and at least one bus-bar electrode 11a or 11b having a wide-width, in order to make an area that blocks incident light as small as possible. The finger electrodes 21a and 21b are electrodes for collecting the photogenerated carriers generated in the photoelectric conversion bodies 10a and 10b. For example, the linear finger electrodes 21a and 21b each having a width of approximately 100 um are arrayed at intervals of 2 mm across almost the entire acceptance faces of the photoelectric conversion bodies 10a and 10b, respectively. Moreover, the bus-bar electrodes 11a and 11b are electrodes for collecting the photogenerated carriers collected by the plurality of finger electrodes 21a and 21b. For example, each of the bus-bar electrodes 11 and 11b is formed into a linear shape with a width of approximately 1 mm so as to intersect with all the finger electrodes 21a or 21b. The number of each of the bus-bar electrodes 11a and 11b is appropriately set, with consideration given to the size and resistance of a solar cell.

In addition, since the other-polarity electrodes are generally provided on the back faces of the photoelectric conversion bodies 10a and 10b, incident light does not need to be taken into account. Accordingly, the other-polarity electrodes may be formed so as to cover almost the entire back faces of the photoelectric conversion bodies 10a and 10b, or may be each formed into a comb-like shape similarly to the electrodes on the acceptance side.

In the case where the other-polarity electrodes are formed so as to cover almost the entire back faces of the photoelectric conversion bodies 10a and 10b, a "first main face" of each of the photoelectric conversion bodies 10a and 10b corresponds to the acceptance face, and a "second main face" thereof corresponds to the back face. On the other hand, in the case where the other-polarity electrode is formed into a comb-like shape on the back face of each of the photoelectric conversion bodies 10a and 10b similarly to the electrodes on the acceptance side, the "first main face" and "second main face" may be any of the acceptance face and the back face.

Additionally, in some solar cells, both of the pair of positive and negative electrodes are provided on the back face of the photoelectric conversion body. In this case, each of the pair of positive and negative electrodes provided on the back face of the photoelectric conversion body is formed into a comb-like shape having a plurality of finger electrodes and at least one bus-bar electrode. In this case, a "first main face" of each of the photoelectric conversion bodies 10a and 10b corresponds to the back face, and a "second main face" thereof corresponds to the acceptance face.

The present invention does not restrict the faces where the pair of positive and negative electrodes is provided. However, in the present embodiment, description will be given of the solar cells each having the pair of positive and negative electrodes on the acceptance face and back face of the photoelectric conversion body, respectively. Moreover, the present invention does not restrict the shape of the electrode provided on the back face of each of the photoelectric conversion bodies 10a and 10b. However, description will be given, as an example, of the solar cells including the plurality of finger electrodes and bus-bar electrodes (shown at 12a and 12b in FIG. 2A) also on the back faces of the photoelectric conversion bodies 10a and 10b.

The wiring member 2a electrically connects the bus-bar electrode 11a and the bus-bar electrode 12b. The bus-bar electrodes 11a, 11b, 12a, and 12b are placed on the acceptance faces and the back faces of the photoelectric conversion bodies 10a and 10b, respectively. The back faces are the reverse sides of the acceptance faces. The finger electrodes 21a and 21b are also placed on the acceptance faces and the back faces of the photoelectric conversion bodies 10a and 10b, respectively.

The plurality of linear finger electrodes 21a and 21b are arrayed on the acceptance faces of the photoelectric conversion bodies 10a and 10b, respectively, in parallel with each other at uniform intervals. The bus-bar electrodes 11a and 11b are placed in the direction orthogonal to the finger electrodes 21a and 21b, respectively. The finger electrodes 21a and 21b collect photogenerated carriers generated in the photoelectric conversion bodies 10a and 10b, and the bus-bar electrodes 11a, 11b, 12a, and 12b further collect photogenerated carriers collected by the plurality of finger electrodes 21a and 21b. The finger electrodes 21a and 21b and the bus-bar electrodes 11a, 11b, 12a, and 12b, which collect the photogenerated carriers generated by the photoelectric conversion bodies 10a and 10b, are collectively called "collector electrodes". The collector electrodes are formed of, for example, thermosetting conductive resin containing epoxy resin as binder and conductive particles as filler. Note, however, that these are not restrictive.

Incidentally, although not shown in the figures, the finger electrodes are arrayed not only on the acceptance faces of the photoelectric conversion bodies 10a and 10b but also on the back faces thereof similarly. Moreover, the wiring member 2b connected to the solar cell 1c is connected to the bus-bar electrode 11b. Further, the solar cell 1c also has a similar configuration to those of the solar cells 1a and 1b.

In addition, each of the photoelectric conversion bodies 10a, 10b, and 10c has a semiconductor junction such as a pn junction or pin junction and is made from semiconductor material, including crystalline semiconductor material such as single-crystal silicon or polycrystalline silicon, thin-film semiconductor material such as amorphous silicon alloy or copper indium selenide or compound semiconductor material such as gallium arsenide or indium phosphide, and the like. In recent years, photoelectric conversion bodies using organic semiconductor material of dye-sensitized type and the like are also considered.

Moreover, each of the photoelectric conversion bodies 10a, 10b, and 10c includes a p-type amorphous silicon layer and an n-type amorphous silicon layer on the top and under surfaces of a single-crystal silicon wafer, with an i-type amorphous silicon layer interposed between the amorphous silicon layer and the single-crystal silicon wafer on each side. An ITO film is formed on the p-type amorphous silicon layers and on the n-type amorphous silicon layer, respectively. Such a structure, in which, as described above, a substantially intrinsic amorphous silicon layer having as large a thickness as it practically does not contribute to electricity generation is sandwiched between a single-crystal silicon layer and an impurity-added amorphous silicon layer, is called "HIT structure" (see Japanese Patent No. 2614561, etc.). The ITO film is exposed on each of the acceptance face and back face of the photoelectric conversion body having the HIT structure.

Figure 2B:
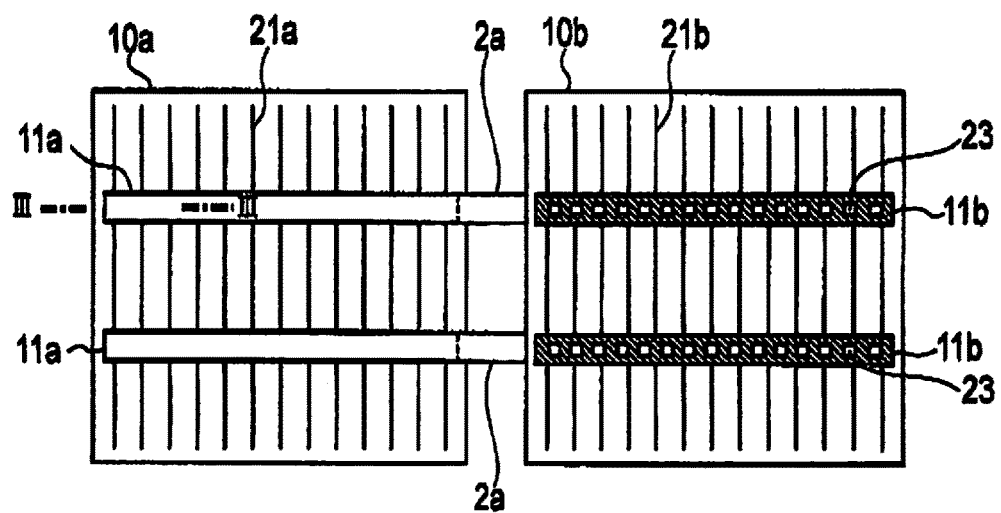

Referring to FIG. 2B, in this embodiment of the present invention, the bus-bar electrode 11b has a plurality of opening portions 23. The plurality of opening portions 23 are arranged at equal intervals in the direction parallel with the longer side of the bus-bar electrode 11b. The acceptance face of the photoelectric conversion body 10b is exposed on the bottoms of the opening portions 23. Similarly, each of the other bus-bar electrodes 11a, 12a, and 12b has similar opening portions 23.

Figure 3:
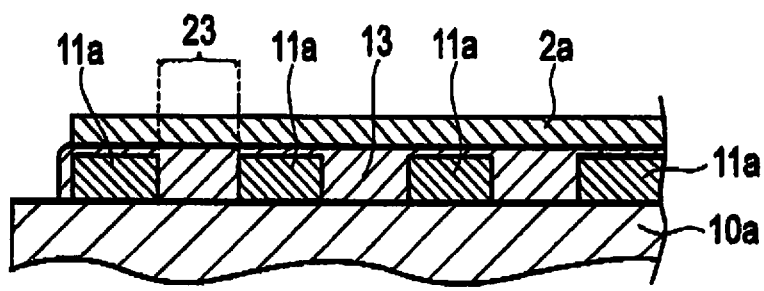
FIG. 3 is an enlarged section view of the vicinity of an acceptance face of the solar cell 1a, taken along the line in FIG. 2B.

Description will be given of the photoelectric conversion body 10a, the bus-bar electrode 11a, and the wiring member 2a, with reference to FIG. 3. FIG. 3 is an enlarged intersection view of the vicinity of the acceptance face of the solar cell 1a, taken along the III-III line in FIG. 2B. A connection layer 13 made of conductive resin is placed between the bus-bar electrode 11a and the wiring member 2a. The connection layer 13 bonds the bus-bar electrode 11a and the wiring member 2a together and electrically connects the bus-bar electrode 11a and the wiring member 2a. The connection layer 13 also fills the opening portions 23 and is in contact with the acceptance face of the photoelectric conversion body 1a at the bottoms of the opening portions 23. Accordingly, the connection layer 13 also bonds the wiring member 2a and the acceptance face of the photoelectric conversion body 10a through the opening portions 23. Note that the solar cell module has similar configurations also on the back-face side of the photoelectric conversion body 10a, on the acceptance-face side and back-face side of the photoelectric conversion body 10b, and on the acceptance-face side and back-face side of the photoelectric conversion body 10c.

Figure 4:
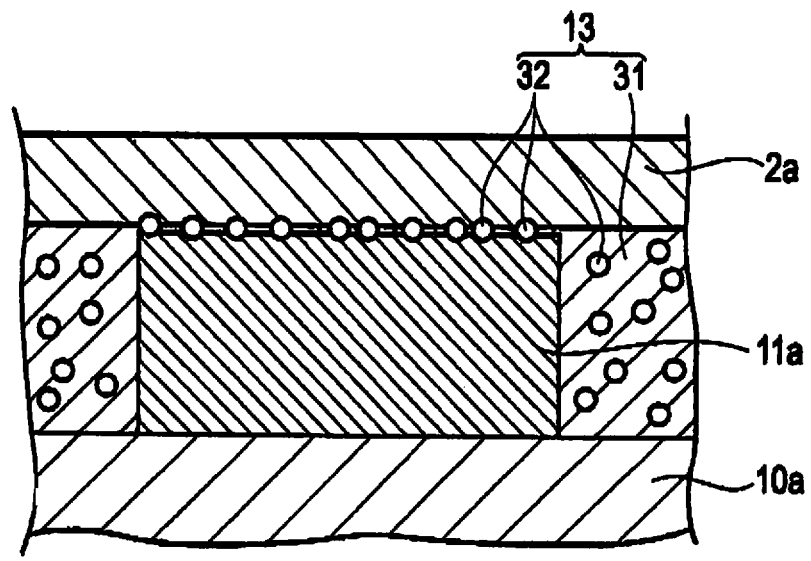
FIG. 4 is a section view to describe the electrical connection between a bus-bar electrode 11a and the wiring member 2a shown in FIG. 3.

Description will be given of the electrical connection between the bus-bar electrode 11a and the wiring member 2a in FIG. 3, with reference to FIG. 4. The connection layer 13 is formed of conductive resin made of a resin 31 containing a plurality of conductive particles 32. The bus-bar electrode 11a and the wiring member 2a are electrically connected through the conductive particles 32. Moreover, the resin 31 bonds the wiring member 2a and the bus-bar electrode 11a together and also bonds the wiring member 2a and the acceptance face of the photoelectric conversion body 10a together.

As mentioned earlier, the collector electrodes (the finger electrodes 21a and 21b and the bus-bar electrodes 11a, 11b, 12a, and 12b) are also formed of conductive resin, similarly to the connection layer 13. Assuming that the material for the connection layer 13 is a "first conductive resin" and the material for the bus-bar electrodes 11a, 11b, 12a, and 12b is a "second conductive resin", the adhesive strength of the first conductive resin to the acceptance faces and back faces of the photoelectric conversion bodies 10a and 10b is stronger than that of the second conductive resin to the acceptance faces and back faces of the photoelectric conversion bodies 10a and 10b. Accordingly, by virtue of the fact that the connection layer 13 bonds the wiring member 2a and the acceptance face of the photoelectric conversion body 10a together, the less-strong adhesive strength of the second conductive resin can be complemented by the connection layer 13 formed of the first conductive resin.

Incidentally, the adhesive strength of the first conductive resin can be enhanced by reducing the density of the conductive particles 32 mixed into the resin 31 (adhesive agent) and thereby increasing the ratio of the resin 31. Moreover, at the same time, if the conductive particles 32 with high hardness are used, since the conductive particles 32 function as spacers, the distance between the wiring member 2a and the bus-bar electrode 11a can be kept at a constant value or more. As a result, since a constant amount or more of the first conductive resin present between the wiring member 2a and the bus-bar electrode 11a can be secured, degradation of the adhesive strength occurring along with a reduction in the amount of the first conductive resin can be suppressed. Thus, the adhesive strength between the bus-bar electrode 11a and the wiring member 2a can be satisfactorily maintained.

However, as the density of the conductive particles 32 is reduced, the conductivity of the conductive resin is lowered. Therefore, in a manufacture process step for electrically connecting the wiring members 2a and 2b to the bus-bar electrodes 11a, 11b, 12a, and 12b by applying pressure in the direction perpendicular to the acceptance faces, the wiring members 2a and 2b are pressed against the bus-bar electrodes 11a, 11b, 12a, and 12b by applying higher pressure than usual. Thereby, as shown in FIG. 4, most part of the resin 31 mainly included in the first conductive resin (the connection layer 13) is squeezed out from between the wiring member 2a and the bus-bar electrode 11a, with the conductive particles 32 being left between the wiring member 2a and the bus-bar electrode 11a, whereby the wiring member 2a and the bus-bar electrode 11a are electrically connected through the conductive particles 32. Thus, electrical conduction between the wiring member 2a and the bus-bar electrode 11a is realized.

The conductive particles 32 are intended for the provision of sufficient electrical conductivity between the bus-bar electrode 11a and the wiring member 2a. For the composition of the conductive particles 32, at least one kind of metal selecting from a group consisting of nickel, copper, silver, aluminum, tin, gold, and the like, or an alloy, a mixture, or the like of any of these metals can be applied. Moreover, at least one kind of metal-coated inorganic oxide selecting from a group consisting of alumina, silica, titanium oxide, glass, and the like may be applied. Alternatively, for the composition of the conductive particles 32, at least one kind of metal-coated resin selecting from a group consisting of epoxy resin, acrylic resin, polyimide resin, phenolic resin, urethane resin, silicone resin, and the like, or a metal-coated copolymer, mixture, or the like of any of these resins may be applied. As for the shape of the conductive particles 32, a spherical shape with a circular or an oval intersection taken along a center axis can be adopted. Moreover, a scheme to enhance the electrical conductivity can also be adopted, such as increasing the surface areas of the conductive particles 32 by making their surfaces rugged.

Preferably, the resin 31 is a material more flexible than the material used for the wiring member 2a, for the purpose of lessening the stress occurred expansion and contraction by the temperature changes of the wiring member 2a. With consideration given to the fact that the resin 31 bonds the wiring member 2a, it is preferable to use a thermosetting resin material for the resin 31. Moreover, to maintain reliability, the resin 31 is required to have excellent resistance against humidity and high-temperature. Examples of a resin meeting these requirements include epoxy resin, acrylic resin, polyimide resin, phenolic resin, urethane resin, silicone resin, and the like. At least one kind of resin selecting from a group consisting of these resins, or a mixture, a copolymer, or the like of any of these resins can be applied to the resin 31. In terms of manufacture, epoxy resin or acrylic resin is preferably used, in point of the capability of setting at low temperature in a short time. Moreover, any of these resins for the resin 31 may be in the form of a film that can be deposited by heat.

Note that, although the collector electrodes (finger and bus-bar electrodes) are formed of thermosetting conductive resin containing epoxy resin as binder and conductive particles as filler as described above, this is an example of the composition of the collector electrodes, and the present invention is not limited to this composition. For the composition of the filler in the collector electrodes, which is intended for the provision of electrical conductivity, at least one kind of metal selecting from a group consisting of copper, silver, nickel, aluminum, tin, gold, and the like, or an alloy, a mixture, or the like of any of these metals can be applied. As for the shape of the filler, a scheme to enhance the electrical conductivity can be adopted, such as mixing flake and spherical shapes, or mixing different sizes. Moreover, the binder in the collector electrodes, whose main purpose is to bond the filler, is required to have excellent resistance to humidity and high-temperature in order to maintain reliability. Examples of a material for the binder meeting such requirements include epoxy resin, acrylic resin, polyimide resin, phenolic resin, urethane resin, silicone resin, and the like. At least one kind of resin selecting from a group consisting of these resins, or a mixture, a copolymer, or the like of any of these resins can be applied to the binder. As for the proportions of the binder and the filler, it is preferable that the filler constitute 70% or more of the conductive resin by weight, with consideration given to electrical conductivity.

Additionally, in the case where the solar cell is composed of a material having high temperature resistance in comparison with amorphous semiconductors, such as a crystalline semiconductor, then a conductive resin material that is baked to set at higher temperature than resin-based conductive resins can be used for the conductive resin. For example, a bake-type conductive resin composed of powder of metal such as silver or aluminum, glass frit, organic vehicle, and the like can be used.

Figure 5:
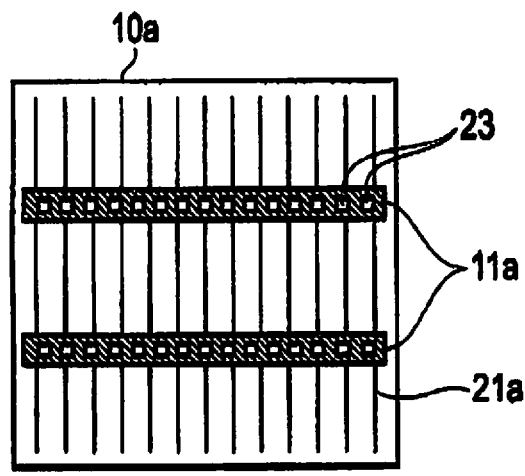
FIG. 5 is a plane view showing the solar cell 1a before the wiring member 2a is connected.

Referring to FIG. 5, the bus-bar electrode 11a has the plurality of rectangular opening portions 23. The acceptance face of the photoelectric conversion body 10a is exposed on the opening portions 23. Each of the other bus-bar electrodes has a similar shape on a plane view.

First Modification Example

Figure 6:
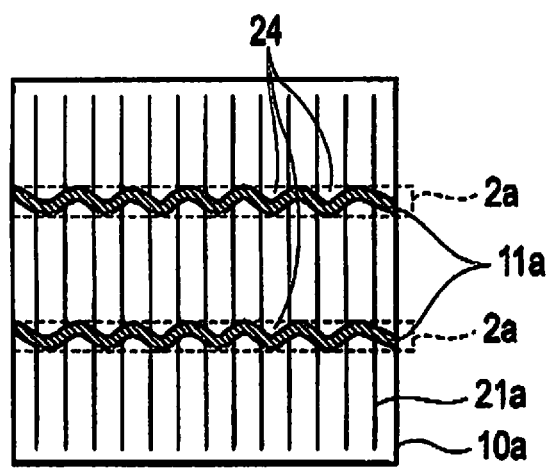
FIG. 6 is a plane view showing the solar cell 1a before the wiring member 2a is connected, according to a first modification example.

In the present invention, the planar shape of the bus-bar electrode is not limited to the one shown in FIG. 5. For example, the bus-bar electrode may be in a non-rectangular shape such as a round shape. As shown in FIG. 6, the bus-bar electrode 11a may be in a non-linear shape and may have a plurality of notch portions 24 instead of the opening portions 23 in FIG. 5. In FIG. 6, broken lines indicate a region where the wiring member 2a is arranged. The acceptance face of the photoelectric conversion body 10a is exposed at the notch portions 24. The connection layer 13 is in contact with the acceptance face exposed at the notch portions 24, whereby the wiring member 2a is bonded to both of the acceptance face of the photoelectric conversion body 10a and the bus-bar electrode 11a.

Second Modification Example

Figure 7:
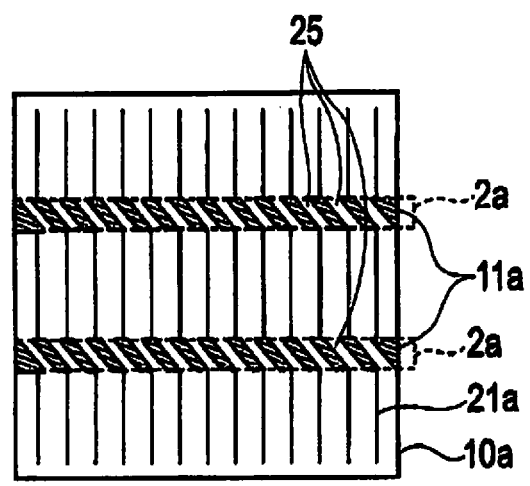
FIG. 7 is a plane view showing the solar cell 1a before the wiring member 2a is connected, according to a second modification example.

The bus-bar electrode 11a may have a plurality of gap portions 25 as shown in FIG. 7 instead of the opening portions 23 in FIG. 5. In FIG. 7, broken lines indicate a region where the wiring member 2a is arranged. The acceptance face of the photoelectric conversion body 10a is exposed from the gap portions 25. The gap portions 25 are filled with the connection layer 13, which is thus in contact with the acceptance face exposed from the gap portions 25, whereby the wiring member 2a is bonded to both of the acceptance face of the photoelectric conversion body 10a and the bus-bar electrode 11a.

Third Modification Example

Figure 8:
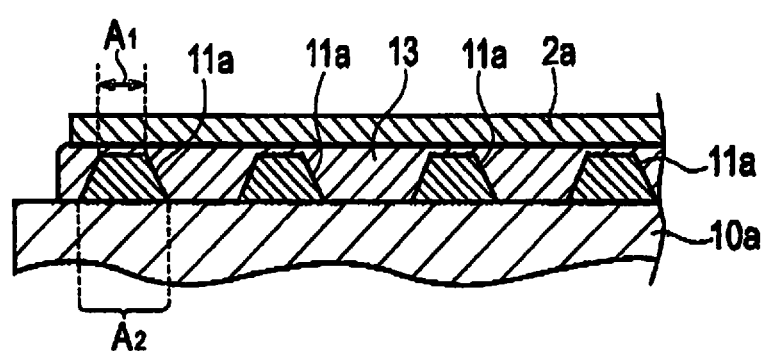
FIG. 8 is an enlarged section view of the vicinity of the acceptance face of the solar cell 1a, according to a third modification example.

In above-mentioned embodiment, the shape of a cross section of the bus-bar electrode 11a is a rectangular. However, as shown in FIG. 8, an area A2, which is the area of a first face of the bus-bar electrode 11a in contact with the acceptance face or back face, may be made larger than an area A1, which is the area of a second face thereof, the reverse of the first face. That is, in the bus-bar electrode 11a, the area A2 on the photoelectric conversion body 10a side may be made larger than the area A1 on the wiring member 2a side. As described earlier, to electrically connect between the wiring member 2a and the bus-bar electrode 11a, the wiring member 2a is pressed against the bus-bar electrode 11a by applying higher pressure than usual. The pressure applied at this time acts on the interface between the wiring member 2a and the bus-bar electrode 11a through the conductive particles 32. Further, the pressure also acts on the interface between the bus-bar electrode 11a and the photoelectric conversion body 10a. In this event, the pressure acting on the photoelectric conversion body 10a is reduced by as much as the area A2 is larger than the area A1, in inverse proportion to the ratio of the area A2 to the area A1.

That is, the force applied from the bus-bar electrode 11a to the photoelectric conversion body 10a can be reduced depending on the ratio between the areas of the first and second faces (A2/A1). Thus, in a manufacture process step for attaching the wiring member 2a to the solar cell 1a, locally applied pressure can be reduced. Accordingly, reliability can be enhanced even if the photoelectric conversion body 10a has insufficient mechanical strength because of the thin wafer or the like.

(Method for Manufacturing the Solar Cell Module)

Next, a method for manufacturing the solar cell module according to the present embodiment will be described.

First, a method for manufacturing the photoelectric conversion body 10a is similar to conventional methods, and therefore description thereof will be omitted here. Next, on the photoelectric conversion body 10a, the bus-bar electrodes 11a and 12a and the finger electrodes 21a are formed using an epoxy thermosetting silver paste. Specifically, the silver paste is screen-printed on the acceptance face of the photoelectric conversion body 10a and then provisionally set by being heated at 150° C. for five minutes. Thereafter, the silver paste is screen-printed on the back face of the photoelectric conversion body 10a and then provisionally set by being heated at 150° C. for five minutes. Thereafter, the silver paste is completely set by being heated at 200° C. for one hour, whereby the solar cell 1a is formed. The solar cells 1b and 1c are also similarly formed.

Next, using a dispenser, an epoxy resin containing approximately 5% by volume of nickel particles is applied in a thickness of approximately 30 µm onto the bus-bar electrodes 11a and 12a. After the resin is applied in this manner onto both of the acceptance face side and the back face side of the photoelectric conversion body of each of solar cells 1a to 1c. Next, the wiring members 2a and 2b are placed on the applied resin and heated at 200° C. for one hour while being pressurized at approximately 2 MPa, whereby a string is formed.

Next, each of a plurality of strings is connected. Glass (the front protective member 3), a sealing sheet (the sealing member 5), the plurality of strings, a sealing sheet (the sealing member 5), and a back sheet (the back protective member 4) are stacked in this order and then, after brought in a vacuum, provisionally compressed together by thermocompression at 150° C. for ten minutes. Thereafter, this provisionally compressed body is completely set by being heated at 150° C. for one hour. Thereafter, a terminal box and a metal frame are attached, thus completing the solar cell module.

OPERATION AND EFFECTS

As described hereinabove, according to the present embodiment of the present invention and examples thereof, the following operation and effects can be obtained.

The solar cell module includes: the two solar cells 1a and 1b including the finger electrodes 21a and 21b and the bus-bar electrodes 11a, 11b, 12a, and 12b placed on the acceptance faces and back faces, which are the reverse sides of the acceptance faces, of the photoelectric conversion bodies 10a and 10b; the wiring member 2a electrically connecting the bus-bar electrodes 11a and 12b of the two solar cells 1a and 1b; and the connection layer 13 formed of the first conductive resin, placed between the wiring member 2a and the bus-bar electrodes 11a and 12b. The connection layer 13 is also in contact with the acceptance face or back face of each of the photoelectric conversion bodies 10a and 10b.

By virtue of the fact that the connection layer 13 is in contact with the acceptance face or back face of the photoelectric conversion body 10a, the wiring member 2a is bonded to the acceptance face or back face of the photoelectric conversion body 10a through the connection layer 13. Therefore, the connection layer 13 complements the adhesive strength between the acceptance face or back face of the photoelectric conversion body 10a and the bus-bar electrode 11a, and accordingly the reliability of the solar cell module against the temperature changes can be enhanced.

It is preferable that the connection layer 13 be in contact with the acceptance face or back face of the photoelectric conversion body 10a in a region where the connection layer 13 overlaps with the wiring member 2a when viewed in the direction perpendicular to the acceptance face. The connection of the connection layer 13 to the photoelectric conversion body 10a in the region where the connection layer 13 overlaps with the wiring member 2a further increases the above-mentioned adhesive strength.

Each of the bus-bar electrodes 11a, 11b, 12a, and 12b has the opening portions 23, notch portions 24, or gap portions 25. The opening portions 23, notch portions 24, or gap portions 25 are filled with the connection layer 13, whereby the connection layer 13 is in contact with the exposed acceptance face or back face of each of the photoelectric conversion bodies 10a and 10b. If the connection layer 13 is contact with the acceptance face or back face of each of the photoelectric conversion bodies 10a and 10b exposed at the opening portions 23, notch portions 24, or gap portions 25 formed on the bus-bar electrodes 11a, 11b, 12a, and 12b, the connection layer 13 is inevitably connected to each of the photoelectric conversion bodies 10a and 10b in the region where the connection layer 13 overlaps with the wiring member 2a. Accordingly, the above-mentioned adhesive strength is further increased.

The bus-bar electrodes 11a, 11b, 12a, and 12b are formed of the second conductive resin, and the adhesive strength of the first conductive resin (the connection layer 13) to the acceptance face or back face is stronger than that of the second conductive resin to the acceptance face or back face. By virtue of this fact, the connection layer 13 formed of the first conductive resin can complement the less-strong adhesive strength of the second conductive resin.

In each of the bus-bar electrodes 11a, 11b, 12a, and 12b, the area of the first face, which comes in contact with the acceptance face or back face, is larger than the area of the second face, which is the reverse of the first face. By virtue of this fact, in a manufacture process step for electrically connecting the wiring member 2a to the bus-bar electrode 11a by applying pressure in the direction perpendicular to the acceptance face, the pressure applied from the bus-bar electrode 11a to the photoelectric conversion body 10a can be reduced depending on the ratio between the areas of the first and second faces.

As described above, the present invention has been described by using one embodiment and modification examples thereof. However, it should be understood that the description and accompanying drawings constituting part of this disclosure are not intended to limit the present invention. From this disclosure, various alternative embodiments, examples, and operational techniques will become apparent to those skilled in the art. That is, it should be understood that the present invention incorporates various embodiments and the like which are not described herein. Accordingly, the present invention should be limited only by matters defining an invention in the claims which are appropriate from the view point of the description.

What is claimed is:

1. A solar cell module, comprising:
two solar cells, each including:
a semiconductor photo-electric conversion body having a first main face and a second main face;
a first electrode on the first main face, the first electrode comprising a bus-bar electrode having one or more opening portions through the bus-bar electrode, the bus-bar electrode directly contacting the first main face; and
a second electrode on the second main face having a polarity opposite to that of the first electrode;
a wiring member that electrically connects the first electrode of one solar cell to the second electrode of another solar cell; and
wherein each of the two solar cells further includes an electrically conductive connection layer that contacts the wiring member and extends continuously across each of the one or more opening portions, the electrically conductive connection layer being in direct contact with the first main face that is exposed at each of the one or more opening portions, wherein in each of the two solar cells:
the first electrode further comprises a plurality of finger electrodes with a constant spacing between adjacent finger electrodes, and
an opening portion length of each of the one or more opening portions in a longitudinal direction of the wiring member is smaller than the constant spacing between adjacent finger electrodes.

2. The solar cell module according to claim 1, wherein in each of the two solar cells:
the opening portion length of each of the one or more opening portions in the longitudinal direction of the wiring member is smaller than a width of the bus-bar electrode.

3. The solar cell module according to claim 1, wherein in each of the two solar cells:
the electrically conductive connection layer contacts the first main face at a bottom of each of the one or more opening portions.

4. The solar cell module according to claim 1, wherein in each of the two solar cells:
the electrically conductive connection layer contacts the wiring member and the first main face through each of the one or more opening portions.

5. The solar cell module according to claim 1, wherein in each of the two solar cells:
the electrically conductive connection layer is thicker than the bus-bar electrode.

6. The solar cell module according to claim 1, wherein in each of the two solar cells:
the electrically conductive connection layer is thicker than a depth of each of the one or more opening portions.

7. The solar cell module according to claim 1, wherein in each of the two solar cells:
an opening portion width of each of the one or more opening portions in a orthogonal direction of the wiring member is smaller than a width of the wiring member.

8. The solar cell module claim according to claim 1, wherein in each of the two solar cells:
the bus-bar electrode has a first face which is in direct contact with the first main face and a second face which is opposite to the first face of the bus-bar electrode, and
an area of the first face of the bus-bar electrode is larger than an area of the second face of the bus-bar electrode.

9. The solar cell module claim according to claim 1, wherein in each of the two solar cells:
at least three opening portions are provided through the bus-bar electrode, and
each of the at least three opening portions is positioned at equal intervals along a longitudinal direction of the bus-bar electrode.

10. The solar cell module according to claim 1, wherein in each of the two solar cells:
more than one opening portions are provided,
the opening portions includes a first opening portion and a second opening portion adjacent to the first opening portion,
the first opening portion is positioned at a first area between adjacent finger electrodes, and
the second opening portion is positioned at a second area adjacent to the first area and overlaps one of the finger electrodes.

11. The solar cell module according to claim 1, wherein in each of the two solar cells:
the plurality of finger electrodes comprise a first finger electrode, a second finger electrode, and a third finger electrode adjacent to the first finger electrode and the second electrode,
more than one opening portions are provided,
the opening portions includes a first opening portion and a second opening portion adjacent to the first opening portion,
the first opening portion is positioned at a first area between the first finger electrode and the third finger electrode, and
the second opening portion is positioned at a second area between the second finger electrode and the third finger electrode.

12. The solar cell module according to claim 1, wherein in each of the two solar cells:
each of the one or more opening portions is positioned between adjacent finger electrodes.

13. The solar cell module according to claim 1, wherein in each of the two solar cells:
each of the one or more opening portions is square as seen from a plan view.

14. The solar cell module of claim 1, wherein in each of the two solar cells:
the bus-bar electrode comprises conductive resin, and
an adhesive strength of the electrically conductive connection layer is greater than an adhesive strength of the bus-bar electrode.

15. The solar cell module of claim 1, wherein in each of the two solar cells the electrically conductive connection layer extends continuously across multiple opening portions under the wiring member.

16. The solar cell module of claim 1, wherein in each of the two solar cells
the electrically conductive connection layer extends continuously from the wiring member to a side wall inside each of the one or more opening portions.

17. The solar cell module of claim 1, wherein in each of the two solar cells
the electrically conductive connection layer fills each of the one or more opening portions.

18. A solar cell module, comprising:
a solar cell, comprising:
a semiconductor photo-electric conversion body having a main face;
finger electrodes on the main face; and a bus-bar electrode on the main face, the bus-bar electrode comprising opening portions having opening portion widths that include a first opening sub-portion positioned at a first area between adjacent finger electrodes; and a second opening sub-portion adjacent to the first opening sub-portion and positioned at a second area adjacent to the first area;

a wiring member that electrically connects to the bus-bar electrode; and an electrically conductive connection layer between the bus-bar electrode and the wiring member, wherein the electrically conductive connection layer contacts the wiring member and extends continuously across the opening portions, the electrically conductive connection layer being in direct contact with the main face.

19. The solar cell module according to claim 18, wherein;

the bus-bar electrode comprises at least three opening portions, and each of the opening portions is positioned at equal intervals along a longitudinal direction of the bus-bar electrode.

20. The solar cell module according to claim 18, wherein:

each opening portion width in an orthogonal direction of the wiring member is smaller than a width of the wiring member.

21. The solar cell module according to claim 18, wherein: a part of the electrically conductive connection layer disposed above the opening portions contacts the wiring member.

22. The solar cell module of claim 18, wherein each of the opening portions is square.

23. A solar cell module, comprising;

a solar cell, comprising:
   a semiconductor photo-electric conversion body having a main face;
   finger electrodes on the main face; and
   a bus-bar electrode on the main face having an opening portion;

a wiring member that electrically connects to the bus-bar electrode such that the opening portion has a length in a longitudinal direction of the wiring member which is smaller than the spacing between adjacent finger electrodes; and an electrically conductive connection layer between the bus-bar electrode and the wiring member, wherein the electrically conductive connection layer contacts the wiring member and extends continuously across the opening portion, the electrically conductive connection layer being in direct contact with the main face.

24. The solar cell module of claim 23, wherein the opening portion is square.

* * * * *